US007417309B2

(12) United States Patent  
Takahashi et al.

(10) Patent No.: US 7,417,309 B2  
(45) Date of Patent: Aug. 26, 2008

(54) CIRCUIT DEVICE AND PORTABLE DEVICE WITH SYMMETRICAL ARRANGEMENT

(75) Inventors: Kouji Takahashi, Gunma (JP); Hideo Matsuki, Saitama (JP); Masami Ito, Gunma (JP); Naoyuki Aoki, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/320,248

(22) Filed: Dec. 27, 2005

(65) Prior Publication Data

US 2006/0145322 A1  Jul. 6, 2006

(30) Foreign Application Priority Data

Dec. 27, 2004  (JP)  ............................ P2004-376147

(51) Int. Cl.  
*H01L 23/02* (2006.01)

(52) U.S. Cl. .................... 257/687; 257/678; 257/730; 257/773; 257/787; 257/676; 257/737; 257/778; 257/666; 257/795; 257/E23.001; 257/E23.194; 438/124; 438/127; 438/106; 438/64; 438/55

(58) Field of Classification Search ................. 257/687, 257/730, 773, 787, 795, 666, 676, 778, 737, 257/678

See application file for complete search history.

(56) References Cited

U.S. PATENT DOCUMENTS 5,739,588 A  4/1998  Ishida et al.

| | | | |
|---|---|---|---|
| 6,624,511 B2 * | 9/2003 | Sakamoto et al. | 257/734 |
| 6,841,852 B2 * | 1/2005 | Luo et al. | 257/666 |
| 2002/0030268 A1 * | 3/2002 | Sakamoto et al. | 257/700 |
| 2004/0104043 A1 * | 6/2004 | Sakai et al. | 174/260 |
| 2005/0104198 A1 * | 5/2005 | Takahashi | 257/708 |
| 2005/0214981 A1 * | 9/2005 | Sakano et al. | 438/127 |

FOREIGN PATENT DOCUMENTS

| | | |
|---|---|---|
| CN | 1132003 A | 9/1996 |
| CN | 1239588 A | 12/1999 |
| JP | 11-274361 | 10/1999 |
| WO | WO 98/25301 | 6/1998 |

\* cited by examiner

*Primary Examiner*—Thao X. Le  
*Assistant Examiner*—Marc-Anthony Armand  
(74) *Attorney, Agent, or Firm*—Fish & Richardson P.C.; Samuel Borodach (57) ABSTRACT

To provide a circuit device freed from constrains of a mounting direction. The circuit device according to the present invention includes: a conductive pattern for forming a die pad, a first bonding pad, and a second bonding pad; and a semiconductor element (TR) attached to the conductive pattern. The circuit device further includes: a sealing resin for covering the semiconductor element (TR) and the conductive pattern with a rear surface of the conductive pattern being exposed; and a coating resin for covering the rear surface of the conductive pattern exposed from the sealing resin. The rear surface of the conductive pattern is exposed from openings of the coating resin, and the openings are arranged with rotational symmetry about a central point of the circuit device.

13 Claims, 10 Drawing Sheets

PRIORART
FIG.10

CIRCUIT DEVICE AND PORTABLE DEVICE WITH SYMMETRICAL ARRANGEMENT

Priority is claimed to Japanese Patent Application Number JP2004-376147 filed on Dec. 27, 2004, the disclosure of which is incorporated herein by reference in its entirety.

BACKGROUND OF THE INVENTION

1. Field of the Invention

The present invention relates to a circuit device and a portable device. In particular, the present invention relates to a circuit device and a portable device, each of which has regularly arranged external electrodes or openings.

2. Description of the Related Art

Heretofore, a circuit device incorporated in an electronic device has been used for cell phones, portable computers, etc. and thus designed to reduce its size, thickness, and weight. In recent years, a device called "CSP (chip-sized package)" of a wafer scale equivalent to a chip size has been developed.

Figure 10:
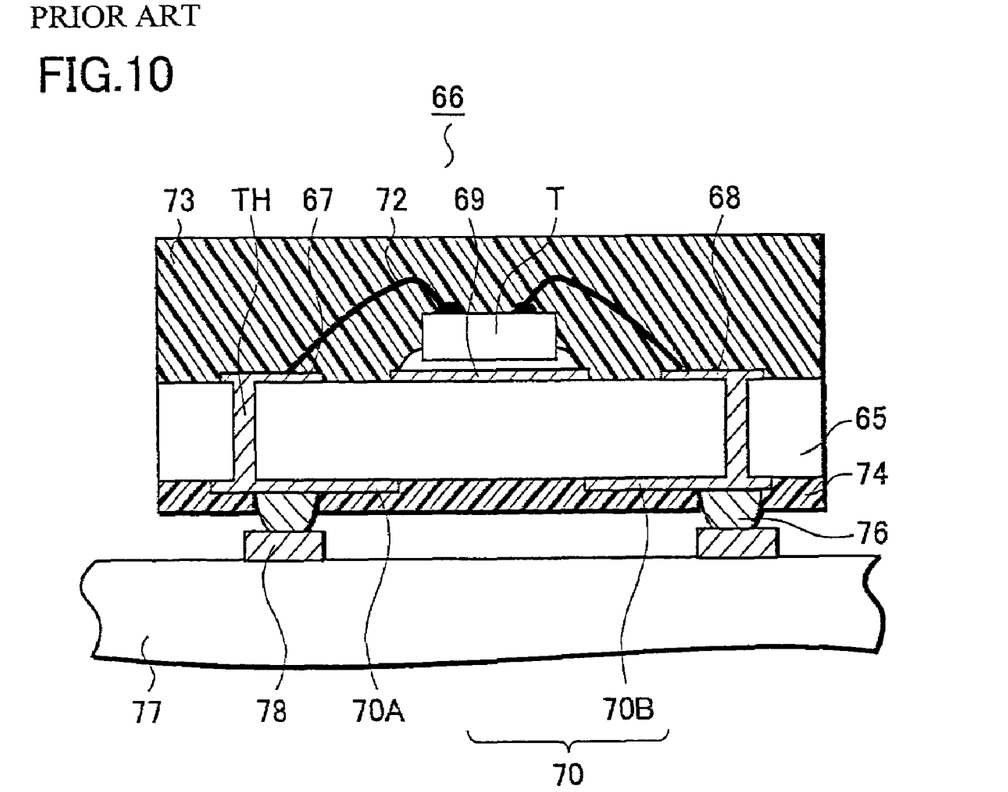
FIG. 10 is a sectional view of a circuit device of the related art.

FIG. 10 shows a CSP 66 of a size slightly larger than a chip size, which has a substrate 65 as a support substrate. In the illustrated example of FIG. 10, a transistor chip T is mounted to the substrate 65.

A first electrode 67, a second electrode 68, and a die pad 69 are formed on the front surface of the substrate 65, and a first back electrode 70A and a second back electrode 70B are formed on the rear surface thereof. The first electrode 67 and the back electrode 70A are connected through a through hole TH. In addition, the second electrode 68 and the second back electrode 70B are electrically connected through the through hole TH.

The transistor chip T is attached to the die pad 69 to connect an emitter electrode of a transistor with the first electrode 67 via a metal thin line 72. Further, abase electrode of the transistor is connected with the second electrode 68 via the metal thin line 72. Furthermore, a resin layer 73 is formed on the substrate 65 to cover the transistor chip T.

In the CSP or other such circuit devices, external electrodes 76 are formed with soldering or the like on the rear surface of the device for receiving/transmitting electrical signals from/to any external device. The CSP 66 is attached to a conductive path 78 formed on the surface of a mounting board 77 through the external electrodes 76. This technology is described for instance in Japanese Patent Application Publication No. Hei 11-274361.

However, in the aforementioned CSP 66, the external electrodes 76 are formed in predetermined positions on a plane in accordance with the specifications of a user. That is, the external electrodes 76 are not arranged regularly on the plane. Therefore, when mounted to the mounting board 77, the CSP 66 should be placed under constraints of the mounting direction. This leads to a higher cost for mounting the CSP 66. In particular, portable devices such as cell phones have a limitation of installation space. Thus, the constraints of the mounting direction of circuit elements hinder the size reduction of the portable devices.

SUMMARY OF THE INVENTION

The present invention has been accomplished in view of the above problems. The invention provides a circuit device that is designed to regularly arrange external electrodes to ease constraints of a mounting direction. The invention also provides a portable device including the circuit device.

A circuit device of the present invention includes: at least one semiconductor element; and a plurality of external electrodes electrically connected with the semiconductor element and transmitting/receiving an electrical signal to/from an external device, wherein the plurality of external electrodes are arranged with rotational symmetry about a central point of the circuit device.

Further, in the circuit device according to the invention, the plurality of external electrodes are arranged with rotational symmetry by an integral multiple of 90°.

Further, in the circuit device according to the invention, the plurality of external devices electrodes each include: a first external electrode connected with a first main electrode of the semiconductor element; a second external electrode connected with a second main electrode of the semiconductor element; and a third external electrode connected with a control electrode of the semiconductor element, and the first external electrode is placed at a central portion, and the second external electrode and the third external electrode are arranged with rotational symmetry to surround the first external electrode.

Further, in the circuit device according to the invention, the semiconductor element is a MOSFET, and the first main electrode is a source electrode, the second main electrode is a drain electrode, and the control electrode is a gate electrode.

Further, in the circuit device according to the invention, the circuit device has a multilayer interconnection structure.

Further, in the circuit device according to the invention, the circuit device incorporates a passive element electrically connected with the semiconductor element.

Further, the circuit device according to the invention further includes a support substrate having a first conductive pattern formed on a front surface and having a second conductive pattern formed on a rear surface, wherein the first conductive pattern is connected with the semiconductor element, and the second conductive pattern is connected with the external electrodes.

A circuit device of the present invention further includes: a conductive pattern; a semiconductor element attached to the conductive pattern; a sealing resin for covering the semiconductor element and the conductive pattern with a rear surface of the conductive pattern being exposed; and a coating resin for coating the rear surface of the conductive pattern exposed from the sealing resin, wherein the rear surface of the conductive pattern is exposed from a plurality of openings formed in the coating resin, and the plurality of openings are arranged with rotational symmetry about a central point.

Further, in the circuit device according to the invention, the plurality of external openings are arranged with rotational symmetry by an integral multiple of 90°.

Further, in the circuit device according to the invention, the plurality of openings include: a first opening for exposing the conductive pattern connected with a first main electrode of the semiconductor element; a second opening for exposing the conductive pattern connected with a second main electrode of the semiconductor element; and a third opening for exposing the conductive pattern connected with a control electrode of the semiconductor element, and the first opening is formed at a central portion, and the second opening and the third opening are arranged with rotational symmetry to surround the first opening.

Further, in the circuit device according to the invention, the semiconductor element is a MOSFET, and the first main electrode is a source electrode, the second main electrode is a drain electrode, and the control electrode is a gate electrode.

Further, in the circuit device according to the invention, the first opening and the second opening are formed in a circular shape, and the third opening is formed in a rectangular shape.

Further, in the circuit device according to the invention, the second opening has a size smaller than the conductive pattern connected with the second main electrode of the semiconductor element, and the third opening has a size larger than the conductive pattern connected with the control electrode of the semiconductor element.

A portable device of the present invention further includes the circuit device.

DETAILED DESCRIPTION OF THE PREFERRED EMBODIMENTS

First Embodiment

Figure 1A:
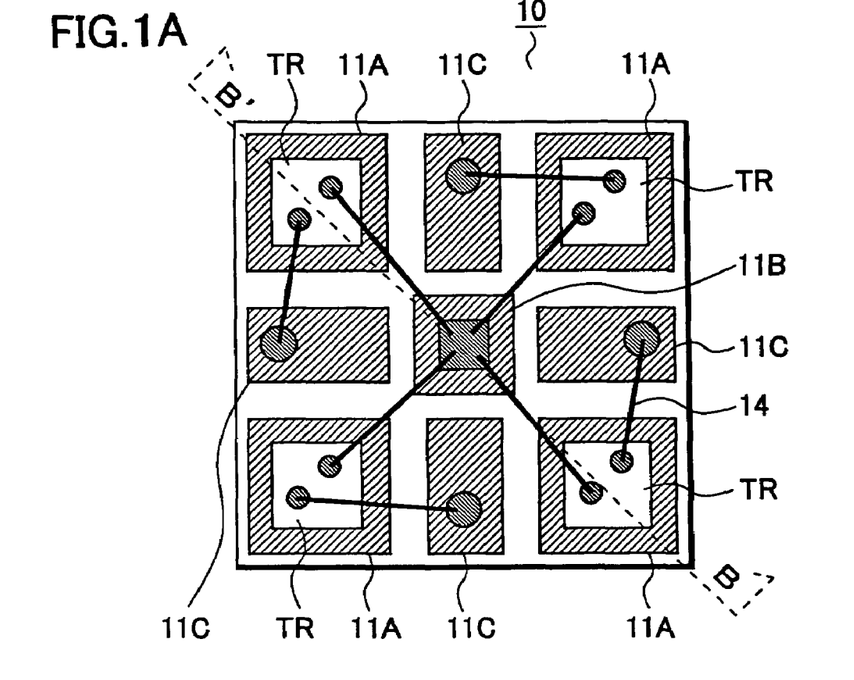
FIG. 1A is a plan view of a circuit device according to a first embodiment of the present invention.
Figure 1B:
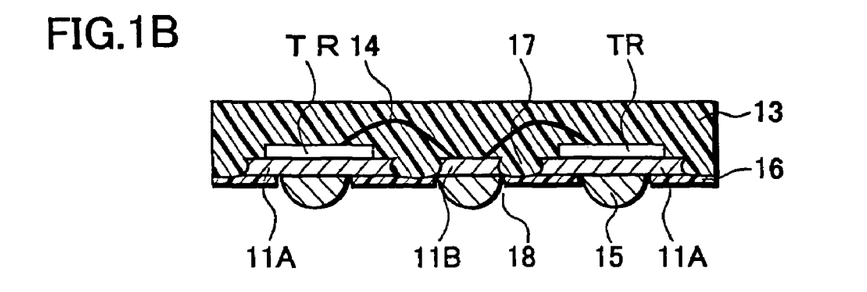
FIG. 1B is a sectional view thereof.
Figure 1C:
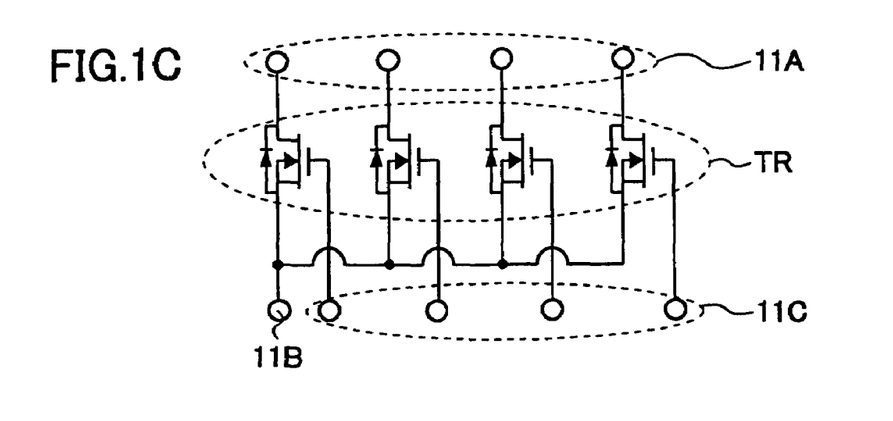
FIG. 1C is a circuit diagram thereof.

Referring to FIGS. 1A to 1C, a circuit device 10 of a first embodiment of the invention is described. FIG. 1A is a plan view of the circuit device 10, FIG. 1B is a sectional view taken along the line B-B' of FIG. 1A, and FIG. 1C is a circuit diagram of an electric circuit incorporated in the circuit device 10.

Referring to FIGS. 1A and 1B, the circuit device 10 of this embodiment includes a conductive pattern 11 that forms a die pad and a bonding pad, a semiconductor element TR electrically connected with the conductive pattern 11, and a sealing resin 13 that covers the semiconductor element TR and the conductive pattern 11 with the rear surface of the conductive pattern 11 being exposed. Further, in this embodiment, the conductive pattern 11, openings 18, and external electrodes 15 are arranged with rotational symmetry about a central point of the circuit device 10. Herein, a MOSFET (metal-oxide semiconductor field effect transistor) is used as the semiconductor element TR by way of example. Incidentally, in this embodiment, a die pad 11A, a first bonding pad 11B, and a second bonding pad 11C are collectively referred to as the conductive pattern 11.

The conductive pattern 11 is composed of the die pad 11A attached with the semiconductor element TR, and the first bonding pad 11B and second bonding pad 11C which are connected with the semiconductor element TR through a metal thin wire 14. A suitable material is selected for the conductive pattern 11 in consideration of an adhesion, bonding property, and plating property of a wax material. Specific examples of the material for the conductive pattern 11 include a conductive foil mainly containing Cu or Al, or a conductive foil containing an Fe—Ni alloy or the like. In this example, the conductive pattern 11 is buried in the sealing resin 13 with the rear surface being exposed. The pads 11A to 11C are isolated by a separation groove 17. The conductive pattern 11 is formed through etching and has curved side faces. In addition, the pads 11A to 11C are separated from one another at a pitch of about 100 μm, for example.

The four die pads 11A are arranged at the corners of the circuit device 10, and the semiconductor elements TR are attached thereonto. The die pad 11A has a square shape as viewed from above and a slightly larger size than the overlying semiconductor element TR. Further, the die pads 11A have the same size.

The first bonding pad 11B is placed at the center of the circuit device 10 and is connected with a source electrode of the semiconductor element TR through the metal thin wire 14. The first bonding pad 11B has a symmetrical shape like a square as viewed from above.

The four second bonding pads 11C are arranged between the die pads 11A arranged at the four corners, and are electrically connected with the source electrode of the semiconductor element TR through the metal thin wire 14. The second bonding pad 11C has a rectangular shape the longitudinal direction of which extends towards the center of the circuit device 10, as viewed from above. The length of the second bonding pad 11C in the widthwise direction opposite to the longitudinal direction (referred to as "width") is smaller than the die pad 11A. This makes it possible to reduce the entire size of the circuit device 10. The second bonding pads 11C are arranged at the midpoint of each surface of the circuit device 10 and have the same size.

Herein, the MOSFET is adopted as the semiconductor element TR and is attached to the die pad 11A at a drain electrode on the rear surface. The semiconductor element TR may be attached to the die pad 11A by means of a soldering or a conductive paste. Other transistors than the MOSFET can be used as the semiconductor element TR. For example, an IGBT (insulated gate bipolar transistor) or a bipolar transistor may be adopted as the semiconductor element TR.

The sealing resin 13 covers the semiconductor element TR, the metal thin wire 14, and the conductive pattern 11 with the rear surface of the conductive pattern 11 being exposed. A thermosetting or thermoplastic resin may be used as the sealing resin 13. The overall circuit device 10 of this embodiment is supported by the sealing resin 13. Further, the sealing resin 13 is filled into the separation groove 17 for separating the pads 11A to 11C from one another.

The separation groove 17 is defined between the pads of the conductive pattern 11 to isolate the pads from each other. The width of the separation groove 17 is uniform in principle, for example, about 100 μm or more. In other words, the pads of the conductive pattern 11 are separated at regular intervals.

The external electrodes 15 are attached to the rear surface of the conductive pattern 11 exposed from the sealing resin 13. A lead eutectic solder, a lead-free solder, a silver paste, a copper paste, and the like can be used for the external electrodes 15.

In this example, a BGA (ball grid array) is formed using the external electrodes 15, but the external electrodes 15 maybe omitted. If omitted, an LGA (land grid array) is formed using the conductive pattern 11 exposed to the rear surface of the circuit device 10.

A coating resin 16 covers the rear surface of the circuit device 10 where the conductive pattern 11 is exposed. The coating resin 16 is partially removed to form the openings 18 where the external electrodes 15 are formed.

In the circuit device 10 of this embodiment, the die pads 11A and the second bonding pads 11C at peripheral portions are arranged with rotational symmetry about the central point by an integral multiple of 90°. Furthermore, the external electrodes 15 attached to the rear surface of each pad are also arranged with rotational symmetry about the central point by an integral multiple of 90°. Besides, the circuit device 10 has a square outer shape as viewed from above. Accordingly, even if the circuit device 10 is one-dimensionally rotated by 90°, 180°, 270°, and 360°, the pads 11A to 11C and the external electrodes 15 are secured in the same positions. Therefore, the constraints of the mounting direction for mounting the circuit device 10 are considerably eased.

Referring to FIG. 1C, a circuit incorporated in the circuit device 10 is described. The four semiconductor elements TR are incorporated in the circuit device 10. Each semiconductor element TR has a gate electrode (control electrode) connected with each second bonding pad 11C through the metal thin wire 14, has a source electrode (first main electrode) connected with the common first bonding pad 11B, and has a drain electrode (second main electrode) connected with each attached die pad 11A. Hence, each semiconductor element TR controls an amount of current flowing between the first bonding pad 11B and the die pad 11A in accordance with control signals individually input from each second bonding pad 11C. In this embodiment, the external electrodes 15 formed on the rear surface of the die pads 11A and the second bonding pads 11C are arranged with the rotational symmetry about the central point of the circuit device 10.

Figure 2A:
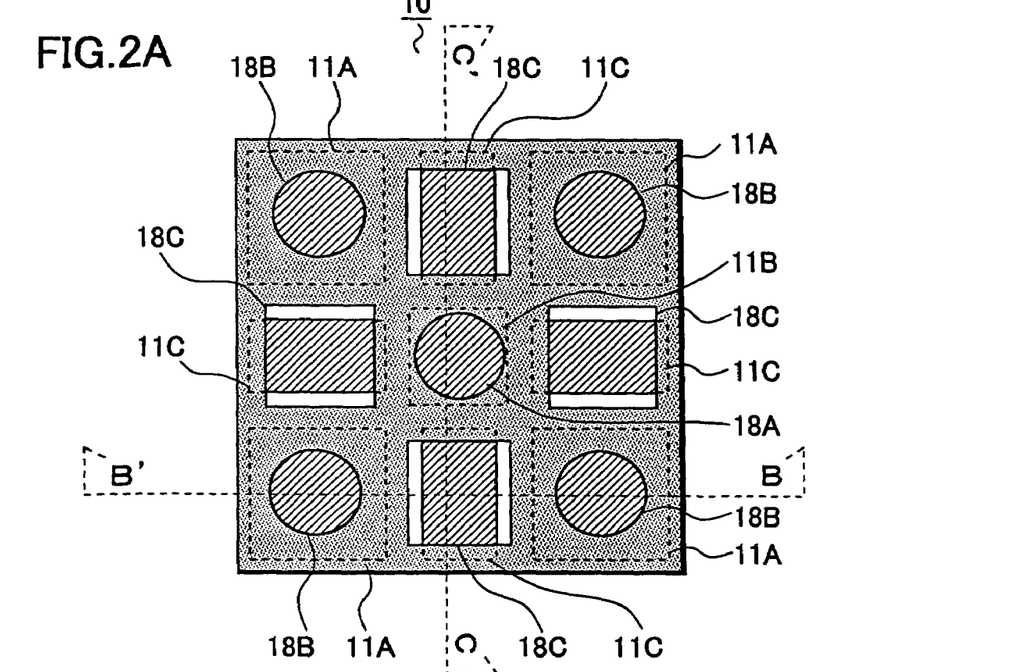
FIG. 2A is a plan view of the circuit device according to the first embodiment of the present invention.
Figure 2B:
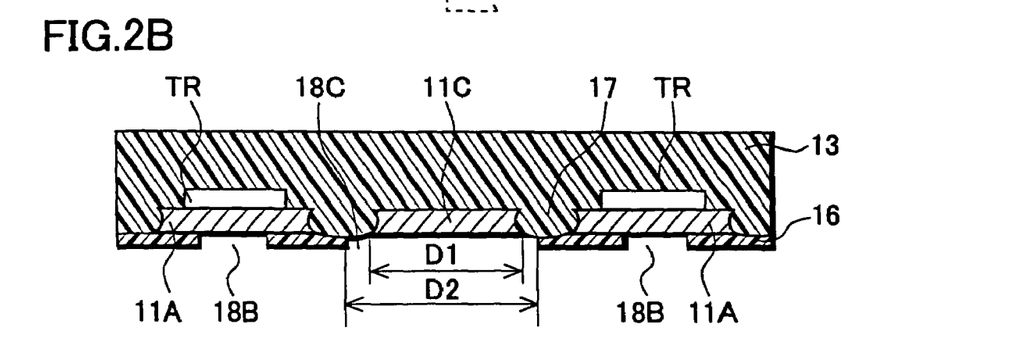
FIG. 2B is a sectional view thereof.
Figure 2C:
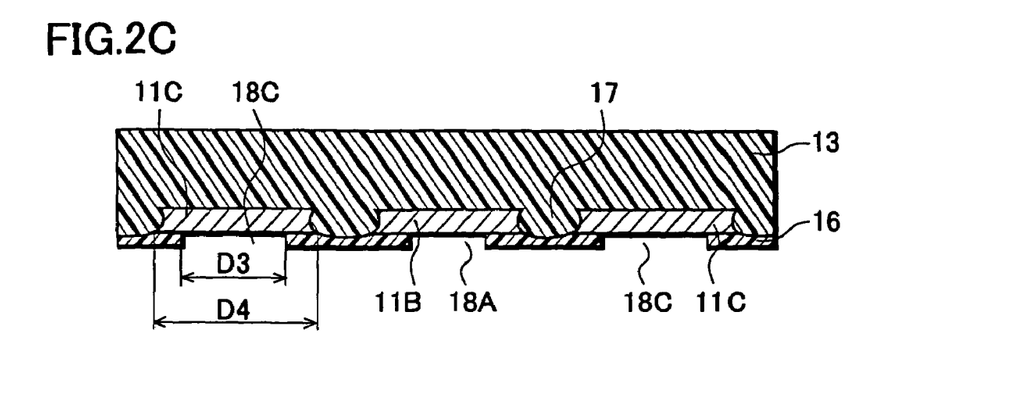
FIG. 2C is a sectional view thereof.

Referring to FIGS. 2A to 2C, the rear-surface structure of the circuit device 10 is described. FIG. 2A is a plan view of the circuit device 10 as viewed from below. FIG. 2B is a sectional view taken along the line B-B' of FIG. 2A. FIG. 2C is a sectional view taken along the line C-C' of FIG. 2A. In the illustrated example, the external electrodes 15 attached to the rear surface of the conductive pattern 11 are omitted.

Referring to FIG. 2A, the rear surface of the die pads 11A arranged at four corners is partially exposed from a circular second opening 18B formed in the coating resin 16. The size of the second opening 18B is smaller than the die pad 11A. Hence, if an external electrode is formed in the second opening 18B through soldering, the coating resin 16 imposes limitations on position and size of the external device. This structure is generally called "solder mask defined (hereinafter referred to as "SMD") structure". The coating resin 16 covers the rear surface of the die pad 11A except the second opening 18B. Since the coating resin 16 covers the rear surface of the die pad 11A, the die pad 11A is kept from peeling off.

The rear surface of the first bonding pad 11B is exposed from a circular first opening 18A formed in the coating resin 16. The first opening 18A is placed at the center of the circuit device 10, and may have the same size as the second opening 18B. The first opening 18A is smaller than the first bonding pad 11B, so the external electrodes attached to the rear surface of the first bonding pad 11B constitute the SMD structure.

The rear surface of each second bonding pad 11C is exposed from a rectangular third opening 18C formed in the coating resin 16. The third openings 18C are individually formed at the midpoint of four adjacent sides. The second bonding pad 11C is narrower than the die pad 11A for reducing the size of the circuit device 10. Thus, it is difficult to form an opening equivalent to the circular second opening 18B on the rear surface of the second bonding pad 11C. To overcome this, in this embodiment, the third opening 18C is formed into a rectangular shape to secure a large area where the rear surface of the second bonding pad 11C is exposed.

In this embodiment, the first opening 18A is placed at the center of the circuit device 10. The second opening 18B and the third opening 18C are arranged with rotational symmetry about the central point of the circuit device 10 by an integral multiple of 90°. Hence, even when the circuit device 10 is one-dimensionally rotated by an integral multiple of 90°, the second openings 18B are always positioned at the corners, and in addition, the third openings 18C are always positioned at the midpoint of each side. Accordingly, the constraints of the mounting direction for mounting the circuit device 10 are considerably eased.

Referring to FIGS. 2B and 2C, the related structures of the second bonding pad 11C and the third opening 18C are specifically described.

As shown in the sectional view of FIG. 2B that is taken along the line B-B', the rear surface of the second bonding pad 11C is throughout exposed from the third opening 18C. That is, a width D2 of the third opening is larger than a width D1 of the second bonding pad 11C. For example, the width D2 is about 0.25 mm, and the width D1 is about 0.23 mm. That is, the width D2 is about 0.02 mm larger than the width D1. Thus, when solder external electrodes are attached to the rear surface of the second bonding pad 11C, the shape of the external electrodes is determined based on a wettability of the solder attached to the rear surface of the second bonding pad 11C. This structure is generally called "non solder mask defined (hereinafter referred to as "NSMD") structure. The NSMD structure enables the external electrodes to be attached throughout the rear surface of the second bonding pad 11C in the B-B' section. Accordingly, the external electrode can be formed with as large a size as possible on the rear surface of the second bonding pad 11C.

Referring to FIG. 2C, in the C-C' section, the coating resin 16 covers both ends of the second bonding pad 11C. That is, a width D4 of the second bonding pad 11C in the C-C' direction is set larger than a width D3 of the third opening 18C. For example, the width D4 is about 0.50 mm, and the width D3 is about 0.30 mm. The coating resin 16 covers and presses both ends of the second bonding pad 11C to prevent the second bonding pad 11C from peeling off.

In the C-C' section, when solder external electrodes are attached to the rear surface of the second bonding pad 11C, the surface area of the external electrodes is limited by the third opening 18C formed in the coating resin 16. That is, in the C-C' section, the shape of the external electrodes is limited based on the SMD structure.

The circuit device 10 thus configured is incorporated in portable devices such as a cell phone, a PDA (portable digital assistant), or a notebook personal computer. The circuit device 10 of this embodiment can save its installation area because of lesser constraint of the mounting direction, which contributes to size reduction of the portable device.

Figure 3A:
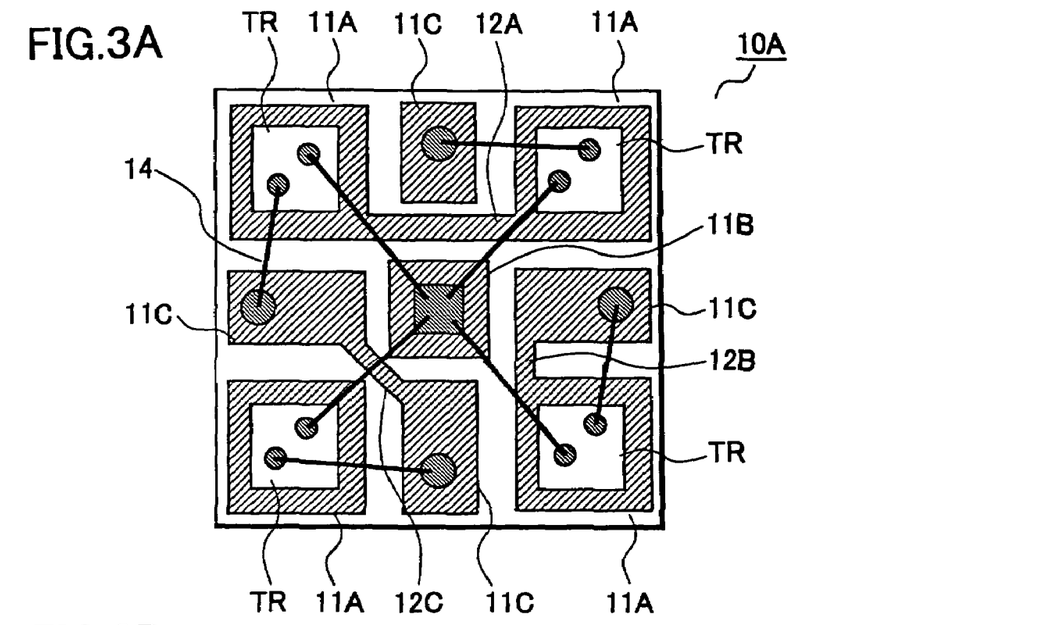
FIG. 3A is a plan view of the circuit device according to the first embodiment of the present invention.
Figure 3B:
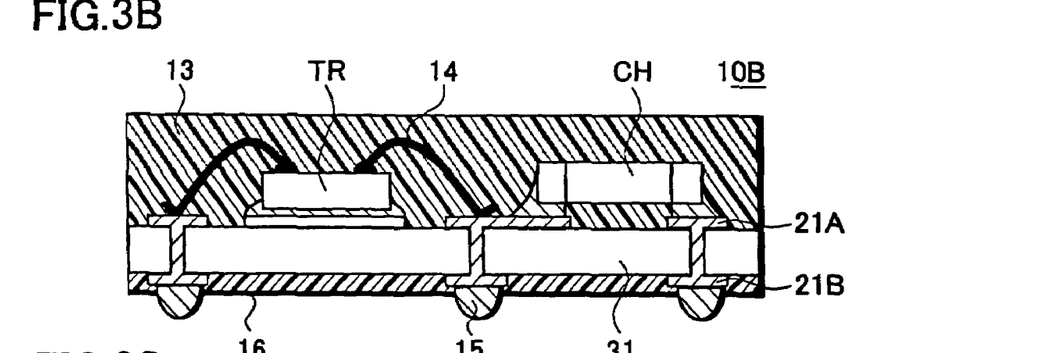
FIG. 3B is a sectional view thereof.
Figure 3C:
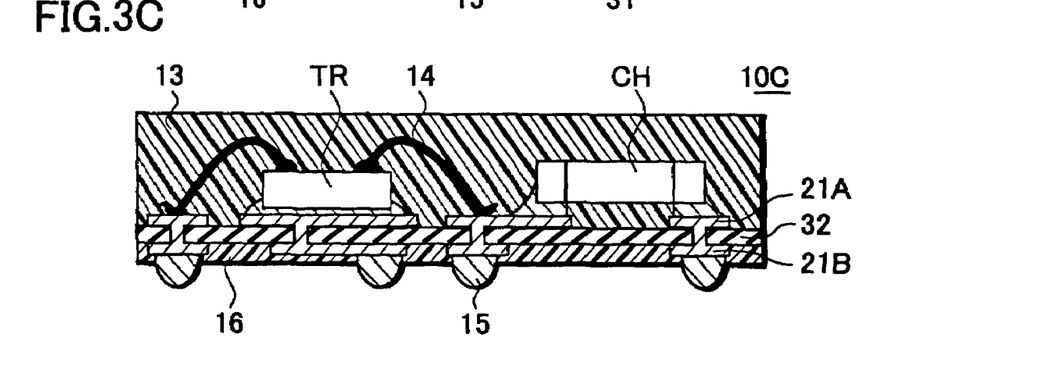
FIG. 3C is a sectional view thereof.

Referring to FIGS. 3A to 3C, another example of the circuit device, a circuit device 10A, is described.

The basic structure of the circuit device 10A of FIG. 3A is the same as the circuit device 10. The circuit device 10A differs from the circuit device 10 exclusively in that wires 12A, 12B, and 12C are provided. The wires 12A to 12C are formed of a part of the conductive pattern 11 and serve to electrically connect circuit elements incorporated in the circuit device 10A. Specifically, the wire 12A extends integrally from the die pads 11A that are placed in an upper portion of FIG. 3A so as to connect these die pads 11A. The wire 12B extends to connect the other die pad 11A with the second bonding pad 11C. Further, the wire 12C extends to connect the second bonding pads 11C.

A circuit device 10B of FIG. 3B has a support substrate 31. A first conductive pattern 21A is formed on the front surface of the support substrate 31, and a second conductive pattern 21B is formed on the rear surface thereof. In addition, the first conductive pattern 21A and the second conductive pattern 21B pass through the support substrate 31 to be connected with each other at predetermined positions. Moreover, in the illustrated example, plural circuit elements are incorporated in the device. More specifically, the semiconductor element TR and a passive element CH are incorporated in the circuit device. As the passive element CH, a chip condenser or a chip resistor may be used. Further, a complicated system including plural circuit elements may be built in the device. As a material for the support substrate 31, metal such as aluminum, a semiconductor such as silicon, a resin, or the like can be used without particular limitations.

With reference to the FIG. 3C, in the circuit device 10C, the first conductive pattern 21A and the second conductive pattern 21B are laminated through an insulating layer 32 that is as thin as about several tens of μm. That is, a multilayer (two-layer) interconnection structure is realized. Incidentally, a three-layer structure may be adopted. The other components are the same as those of the circuit device 10B.

Second Embodiment

Referring next to FIGS. 4A to 9B, a manufacturing method for the above circuit device 10 is described.

As shown in FIGS. 4A to 5B, a first step of the embodiment of the present invention is forming a separation groove 17 in a conductive foil 40 to obtain a protruding conductive pattern 11.

Figure 4A:
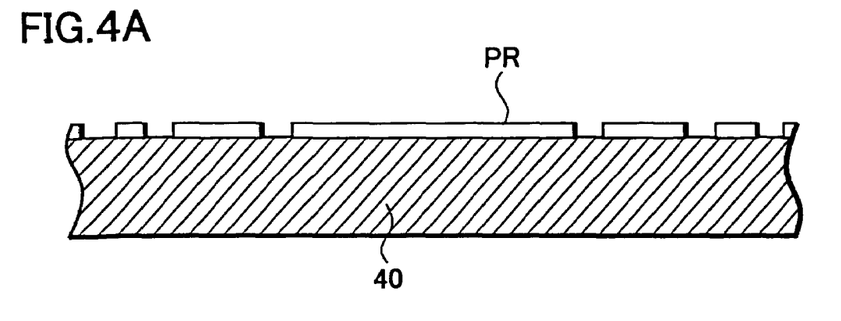
FIG. 4A is a sectional view of a manufacturing method for a circuit device according to a second embodiment of the present invention.
Figure 4B:
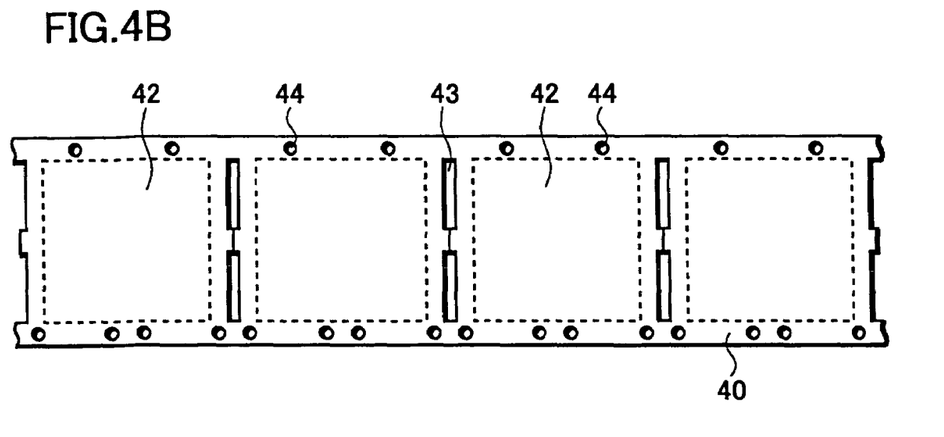
FIG. 4B is a plan view thereof.

In this step, as shown in FIG. 4A, the sheet-like conductive foil 40 is prepared. The conductive foil 40 is one mainly containing Cu or AL, or one containing an Fe—Ni alloy. The thickness of the conductive foil is desirably about 100 to 300 μm for ease of etching that is carried out later. To elaborate, as shown in FIG. 4B, four or five blocks 42, in which many units are formed, are arranged away from one another in the strip-like conductive foil 40. Slits 43 are defined between the blocks 42 to absorb stress on the conductive foil 40 which is generated during a heating process in a molding step or the like. Index holes 44 are formed at the upper and lower edges of the conductive foil 40 at regular intervals and used for positioning in each step.

As shown in FIG. 4A, a resist PR as an etching-resistant mask is first formed on the conductive foil 40. The resist PR is patterned so that the surface of the portion of the conductive foil 40 is exposed, the portion corresponding to the separation groove to be formed. This patterned resist PR is used as an etching mask for wet etching to thereby etch the exposed portion of the conductive foil 40 into the separation groove.

Figure 5A:
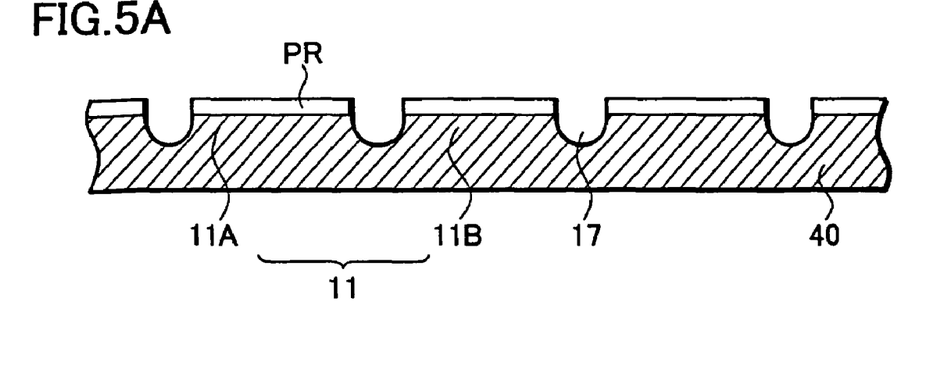
FIG. 5A is a sectional view of the manufacturing method for the circuit device according to the second embodiment of the present invention.
Figure 5B:
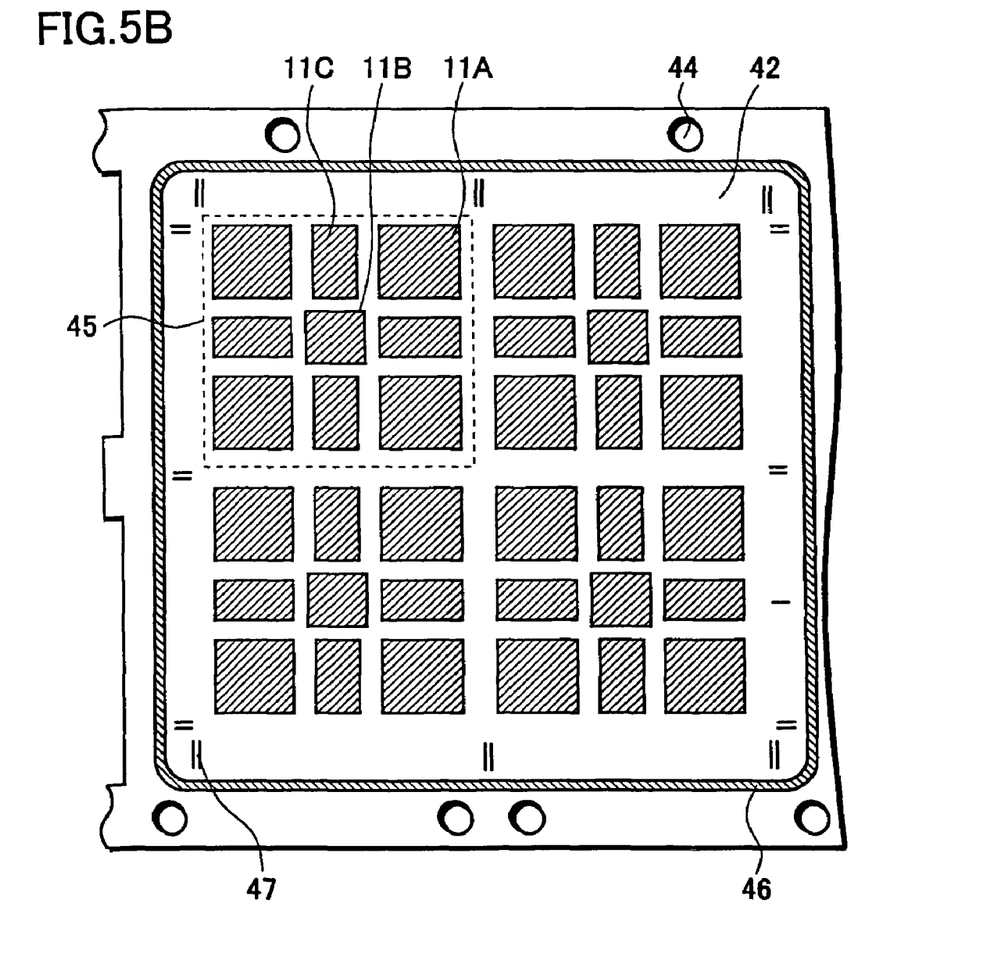

Referring to FIGS. 5A and 5B, a specific shape of the conductive pattern 11 formed in this step is described. FIG. 5A is a sectional view of the conductive foil 40 having the separation groove 17, and FIG. 5B is a plan view thereof.

As shown in FIG. 5A, the separation grooves 17 are formed on the surface of the conductive foil 40 to obtain the conductive pattern 11, which is protruding in a convex shape.

FIG. 5B specifically shows the conductive pattern 11, which is an enlarged view of one block 42 of FIG. 4B. A portion surrounded by the dotted line corresponds to one unit 45. The plural units 45 are arranged in matrix in one block 42 and have the same conductive pattern 11 in every unit 45. In this example, the conductive pattern 11 including a die pad 11A, a first bonding pad 11B, and a second bonding pad 11C is formed. In FIG. 5B, the four (2×2) units 45 arranged, but any more units may be formed. Further, after the completion of this step, the resist PR is removed.

Figure 6A:
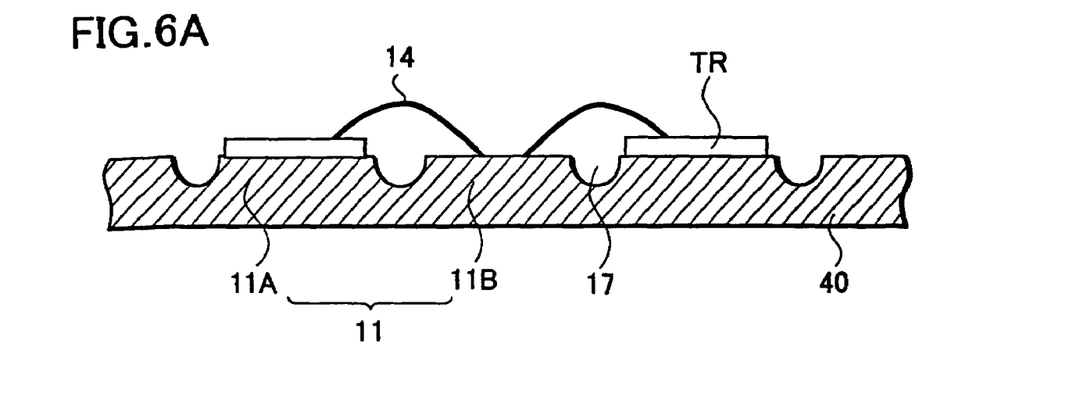
FIG. 6A is a sectional view of the manufacturing method for the circuit device according to the second embodiment of the present invention.
Figure 6B:
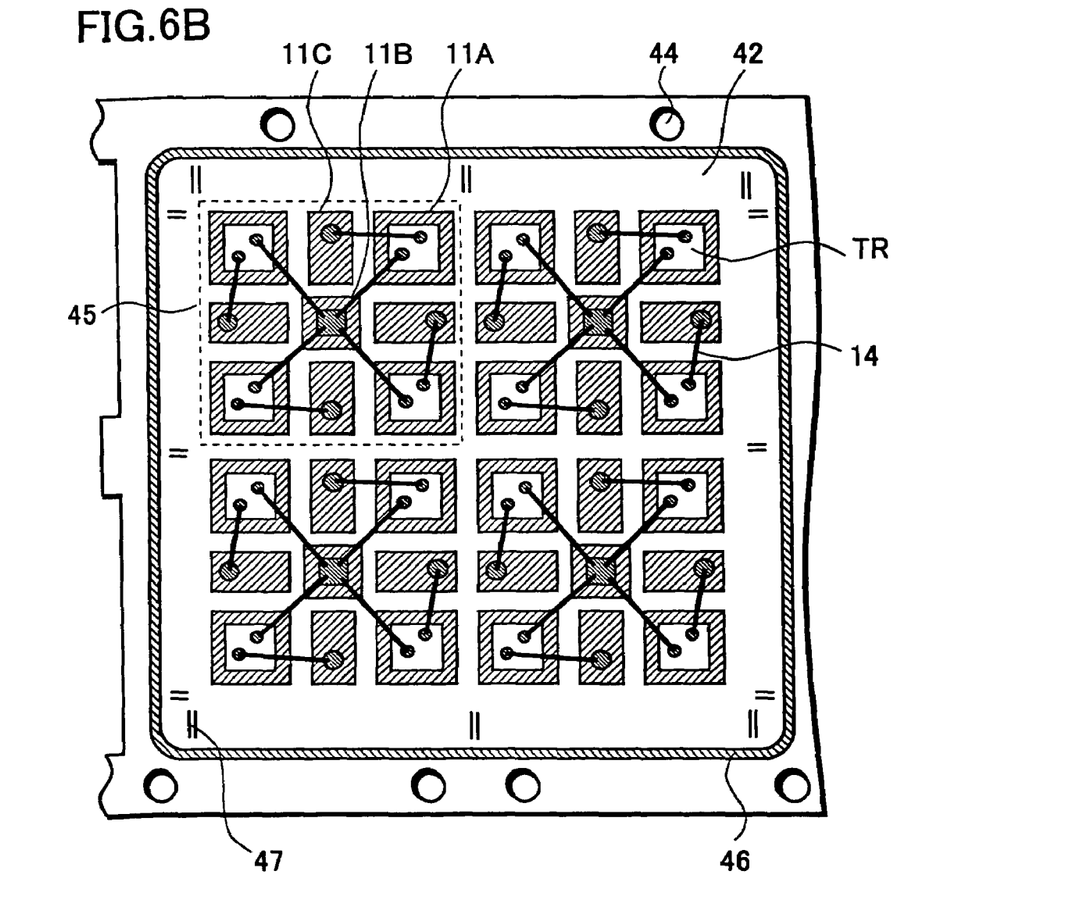
FIG. 6B is a plan view thereof.

As shown in a sectional view of FIG. 6A and a plan view of FIG. 6B, a second step of the embodiment of the present invention is attaching the semiconductor elements TR to the conductive pattern 11.

In this example, the semiconductor elements TR are attached to the die pads 11A of each unit 45. The rear surface (drain electrode) of each semiconductor element TR is bonded to the upper surface of each die pad 11A through gold-silicon eutectic bonding. Alternatively, the semiconductor element TR may be attached using a solder or a conductive paste.

At the completion of the above step, the electrical connection with the semiconductor element TR is established using a metal thin wire 14. To be specific, the first bonding pad 11B positioned at the center of the unit 45 is connected with the source electrode of the semiconductor element TR through the metal thin wire 14. Further, the second bonding pads 11C arranged between the die pads 11A are each connected with the gate electrode of the semiconductor element TR through the metal thin wire 14.

Figure 7A:
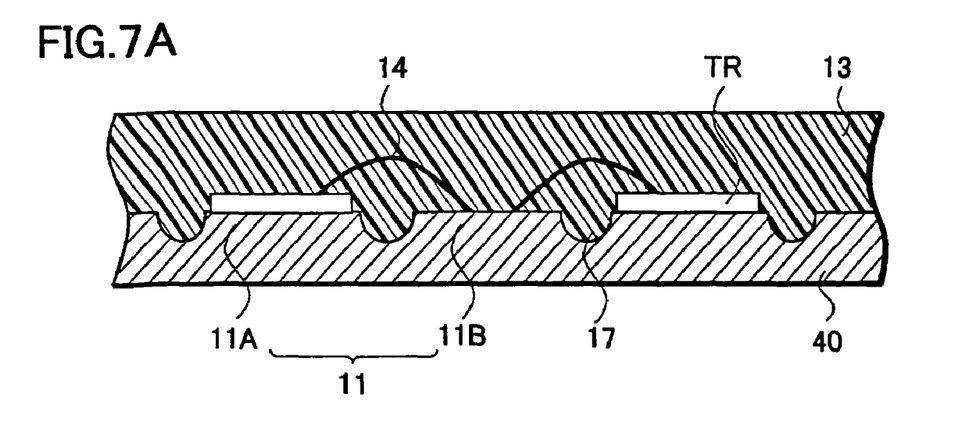
FIGS. 7A to 7C are sectional views of the manufacturing method for the circuit device according to the second embodiment of the present invention.
Figure 7B:
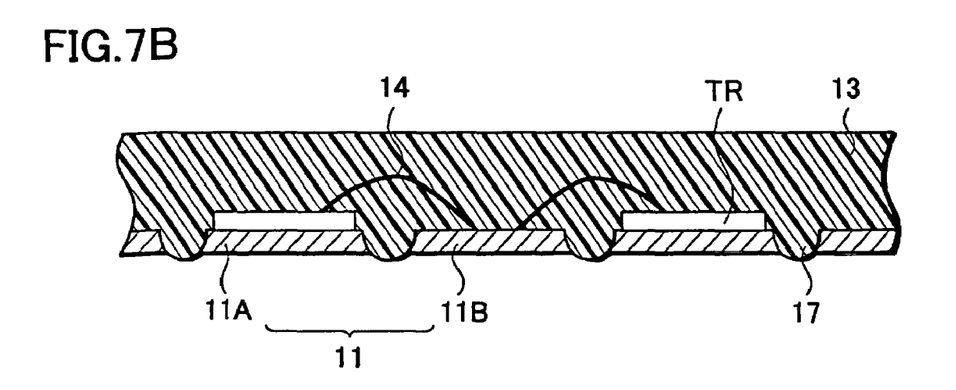
Figure 7C:
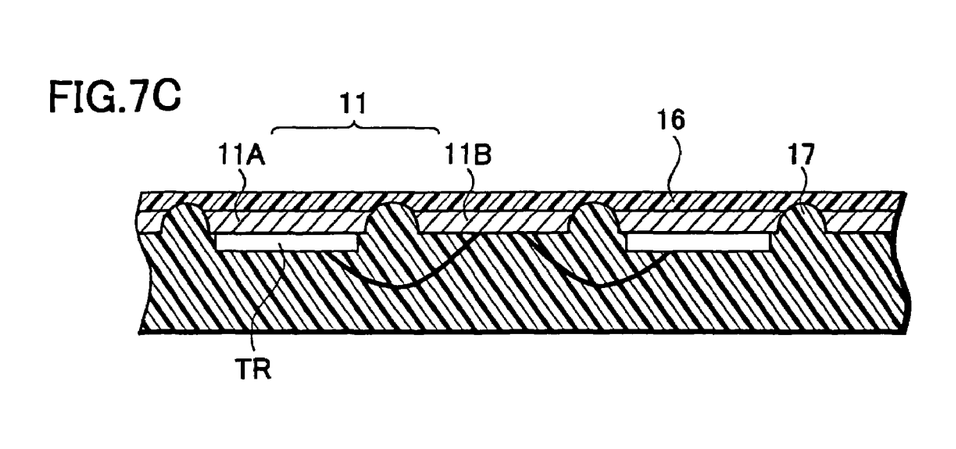

As shown in FIGS. 7A to 7C, a third step of the embodiment of the present invention is forming a sealing resin 13, and after separating the pads, forming a coating resin 16.

As shown in FIG. 7A, the sealing resin 13 is first formed so as to cover the semiconductor element TR and the metal thin wire 14 and fill the separation groove 17. Here, the sealing resin 13 is securely fitted into the curved side portions of the conductive pattern 11.

Referring to FIG. 7B, all the conductive foil 40 is next etched from the rear surface until the sealing resin 13 filled in the separation groove 17 is exposed. Through this step, the pads of the conductive pattern 11 are isolated from one another.

As shown in FIG. 7C, the coating resin 16 is next formed to cover the conductive pattern 11 exposed from the sealing resin 13. The coating resin 16 is formed by applying a liquid resin to the exposed conductive pattern 11 and curing the resin.

Figure 8A:
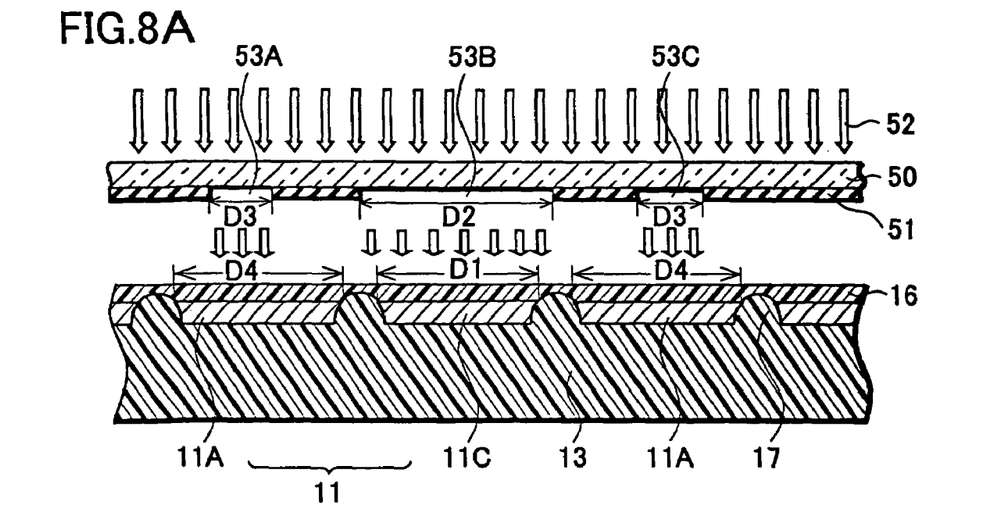
FIG. 8A is a sectional view of the manufacturing method for the circuit device according to the second embodiment of the present invention.
Figure 8B:
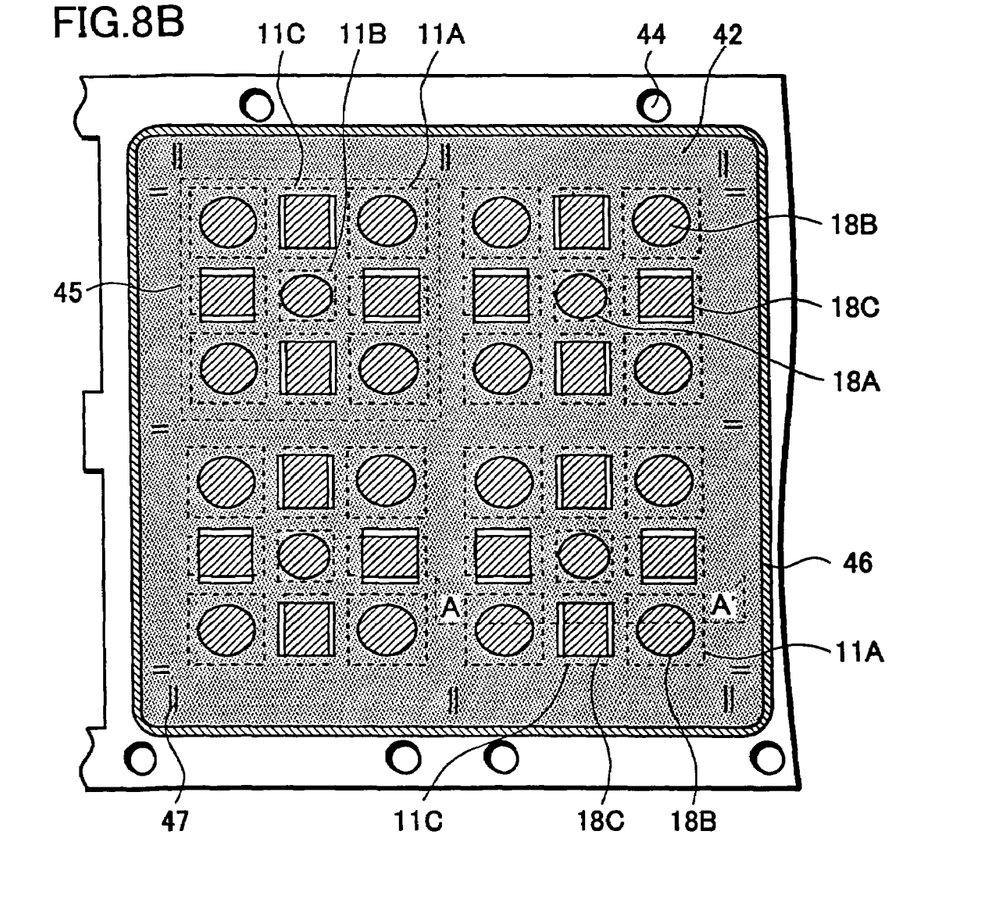
FIG. 8B is a plan view thereof.

As shown in FIGS. 8A and 8B, a fourth step of the embodiment of the present invention is partially removing the coating resin 16 to form openings. FIG. 8A is a sectional view of a step of exposing openings 18 to the light, and FIG. 8B is a plan view of the block 42 after the openings 18 are formed. The sectional view of FIG. 8A is taken along the line A-A' of FIG. 8B.

Referring fist to FIG. 8A, the coating resin 16 is exposed to the light so as to form the opening. In this example, a positive resist that allows removal of an exposed portion is used as the coating resin 16. Accordingly, a portion of the coating resin 16 exposed to a light beam 52 is removed with an alkali solvent. Alternatively, a negative resist may be used as the coating resin. In this case, an exposure pattern 51 and an exposing portion 53A or the like are inverted in position of FIG. 8A.

An exposure mask 50 is set above the coating resin 16, and the exposure pattern 51 partially covers the exposure mask 50 so as to shield the coating resin 16 from the light except the openings. Further, the exposing portion 53A or the like is secured on the exposure mask 50 in positions corresponding to the openings, without being covered with the exposure pattern 51. After that, if parallel beams 52 are applied from above the exposure mask 50, a portion of the coating resin 16 positioned below the exposing portions 53 is selectively exposed. After being exposed, the coating resin 16 is immersed in an alkali solution, and then a photosensitized portion of the coating resin 16 is melted and removed to form the opening.

The exposing portions 53A and 53C correspond to a circular second opening 18B formed on the rear surface of the die pad 11A, and have a size D3 smaller than the width D4 of the die pad 11A. More specifically, the size D3 of the exposing portions 53A and 53C is about 0.3 mm, and the width D4 of the die pad 11A is about 0.5 mm. Hence, the rear surface of the die pad 11A is partially exposed from the coating resin 16 through this step.

The exposing portion 53B corresponds to the rectangular third opening 18C formed on the rear surface of the second bonding pad 11C. Further, the width of the exposing portion 53B is set larger than the width of the second bonding pad 11C. For example, the width D2 of the exposing portion 53B is about 0.25 mm, and the width D1 of the second bonding pad 11C is about 0.23 mm. As a result, the rear surface of the second bonding pad 11C is entirely exposed from the coating resin 16 in the sectional view of FIG. 8A.

As mentioned above, the width of the exposing portion 53B is set larger than the second bonding pad 11C, making it possible to entirely expose the rear surface of the second bonding pad 11C from the coating resin 16. For example, if the exposure mask 50 is placed with an error of several tens of μm, the exposing portion 53B is accordingly misaligned with respect to the second bonding pad 11C. Even in such a case, since the width D2 of the exposing portion 53B is much larger than the width D1 of the second bonding pad 11C, the entire rear surface of the second bonding pad 11C can be exposed from the coating resin 16.

If the entire rear surface of the second bonding pad 11C can be exposed from the coating resin 16, solder external electrodes can be easily attached to the rear surface of the second bonding pad 11C in a subsequent step.

Figure 9A:
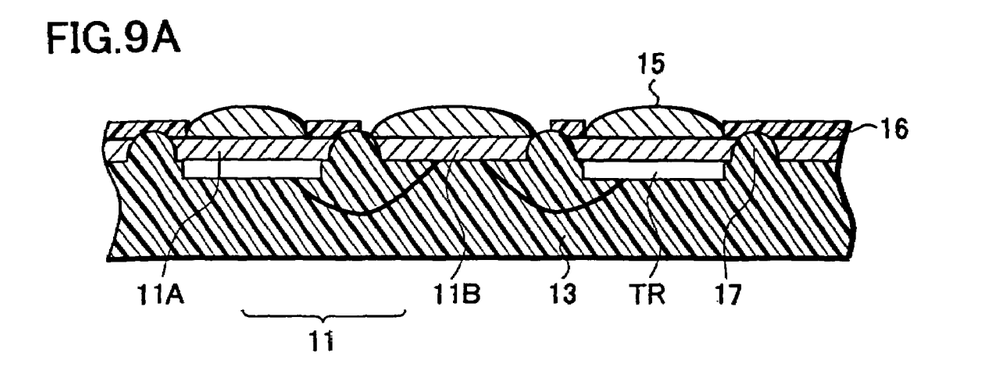
FIG. 9A is a sectional view of the manufacturing method for the circuit device according to the second embodiment of the present invention.
Figure 9B:
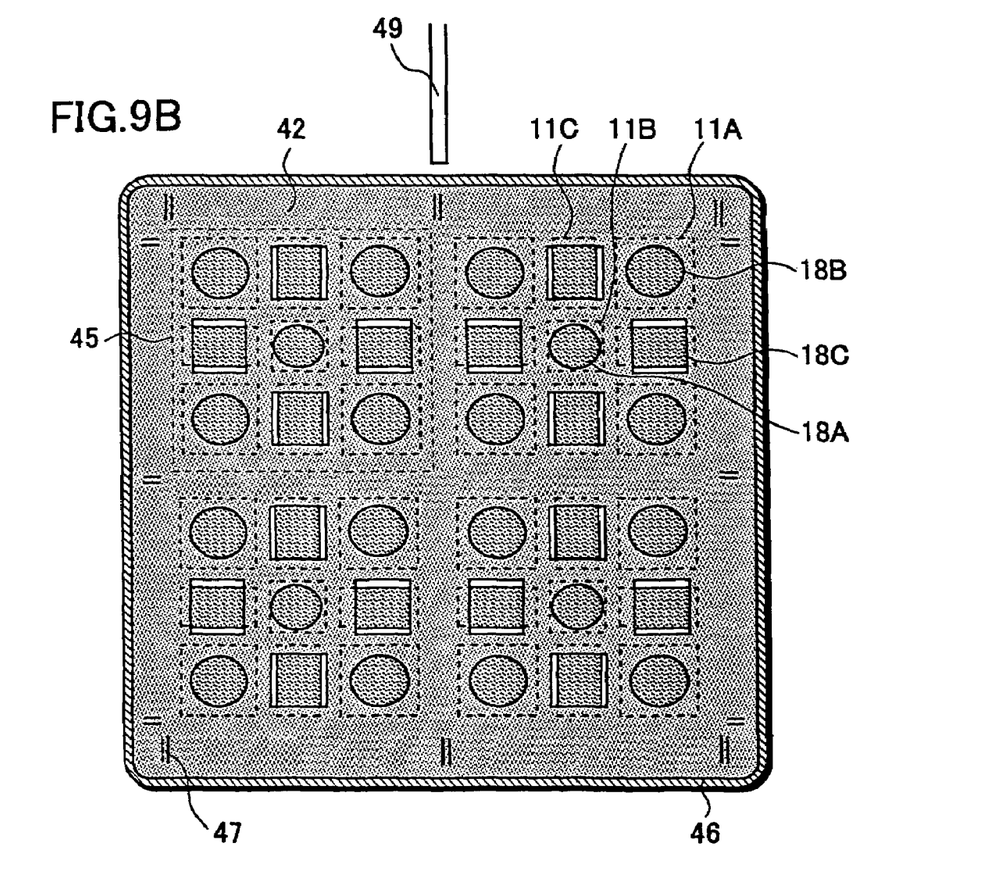
FIG. 9B is a plan view thereof.

As shown in FIGS. 9A and 9B, a fifth step of the embodiment of the present invention is dicing the sealing resin 13 for each unit 45. FIG. 9A is a sectional view of the fifth step, and FIG. 9B is a plan view thereof.

Referring to FIGS. 9A and 9B, the external electrodes 15 are attached to the rear surface of the conductive pattern 11 exposed from the first opening 18A. As a material for the external electrode 15, a solder or a conductive paste is used. If a solder or the like is not used, the conductive pattern 11 exposing from the coating resin 16 to the outside serves as the external electrode.

In this step, the sealing resin 13 is diced into separate circuit devices along a dicing line between the units 45 with a blade 49. There is only the sealing resin 13 filled in the separation groove 17 on the dicing line, so a friction of the blade 49 is small. Further, the resin can be diced into a considerably accurate shape without causing any flash.

According to the circuit device of the embodiments of the present invention, the external electrodes or openings are arranged with rotational symmetry about a central point. Accordingly, even if the circuit device is mounted while rotated by an integral multiple of 90°, such a package as establishes a predetermined electric circuit or system can be realized. This eases the constraints of the mounting direction in which the circuit device is mounted.

In addition, the portable device according to the embodiments of the present invention includes the circuit device and thus enables size reduction.

What is claimed is:

1. A circuit device, comprising:
a plurality of conductive elements;
a plurality of semiconductor elements attached to the conductive elements;
a sealing resin for covering the semiconductor elements and the conductive elements, wherein the rear surfaces of the conductive elements are exposed; and
a coating resin for coating the rear surfaces of the conductive elements exposed from the sealing resin,
wherein each semiconductor element is electrically connected to a different subset that includes more than one of the conductive elements, and
wherein the rear surfaces of the conductive elements are exposed from a plurality of openings formed in the coating resin, and the plurality of openings comprises subsets of openings that correspond to the subsets of the conductive elements and that are arranged to be symmetric at set intervals of rotation of the circuit device about a central point wherein the set intervals of rotation are integral multiple of 90° C.

2. The circuit device according to claim 1,
wherein the plurality of openings include:
a first opening for exposing a first conductive element connected with a first main electrode of a semiconductor element;
a second opening for exposing a second conductive element connected with a second main electrode of the semiconductor element; and
a third opening for exposing a third conductive element connected with a control electrode of the semiconductor element, and
wherein the first opening is formed at a central portion, and the second opening and the third opening are arranged with rotational symmetry to surround the first opening.

3. The circuit device according to claim 1, wherein the circuit device incorporates a passive element electrically connected with the semiconductor element.

4. The circuit device according to claim 2,
wherein the semiconductor element is a MOSFET, and
wherein the first main electrode is a source electrode, the second main electrode is a drain electrode, and the control electrode is a gate electrode.

5. The circuit device according to claim 2, wherein the first opening and the second opening are formed in a circular shape, and the third opening is formed in a rectangular shape.

6. The circuit device according to claim 2, wherein the second opening is smaller than the conductive element connected with the second main electrode of the semiconductor element, and the third opening is larger than the conductive element connected with the control electrode of the semiconductor element.

7. A circuit device comprising:
a plurality of semiconductor elements; and
a plurality of conductive elements;
wherein each semiconductor element is electrically connected to a different subset that includes more than one of the conductive elements, and
wherein the arrangement of the subsets of the conductive elements is symmetric at set intervals of rotation of the circuit device about a central point wherein the set intervals of rotation are integral multiple of 90°.

8. The circuit device according to claim 7, wherein the plurality of conductive elements include:
a first conductive element connected with a first main electrode of the semiconductor element;
a second conductive element connected with a second main electrode of the semiconductor element; and
a third conductive element connected with a control electrode of the semiconductor element, and
wherein the first conductive element is placed at a central portion, and the second conductive element and the third conductive element are arranged with rotational symmetry to surround the first conductive element.

9. The circuit device according to claim 8,
wherein the semiconductor element is a MOSFET, and
wherein the first main electrode is a source electrode, the second main electrode is a drain electrode, and the control electrode is a gate electrode.

10. The circuit device according to claim 7, wherein the circuit device has a multilayer interconnection structure.

11. The circuit device according to claim 7, wherein the circuit device incorporates a passive element electrically connected with the plurality of semiconductor elements.

12. The circuit device according to claim 7, further comprising a support substrate having a first conductive pattern formed on a front surface and a second conductive pattern formed on a rear surface,
wherein the first conductive pattern is connected with the plurality of semiconductor elements, and the second conductive pattern is connected with the plurality of conductive elements.

13. A portable device comprising the circuit device according to any one of claims 2-6, 7, 8-12.

* * * * *